(12) United States Patent
Sculley et al.

(10) Patent No.: US 6,747,858 B1
(45) Date of Patent: Jun. 8, 2004

(54) DIGITAL SAMPLE RATE CONVERTER ARCHITECTURE

(75) Inventors: Terry L. Sculley, Austin, TX (US); Xianggang Yu, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/335,085

(22) Filed: Dec. 31, 2002

(51) Int. Cl.[7] ................................................ H03M 7/00
(52) U.S. Cl. ........................................................ 361/61
(58) Field of Search ............................................ 341/61

(56) References Cited

U.S. PATENT DOCUMENTS

| | | | |
|---|---|---|---|
| 5,475,628 A | 12/1995 | Adams et al. | 364/724.1 |
| 5,497,152 A | * 3/1996 | Wilson et al. | 341/61 |
| 5,666,299 A | 9/1997 | Adams et al. | 364/724.011 |
| 5,980,097 A | * 11/1999 | Dagnachew | 708/314 |
| 6,141,671 A | 10/2000 | Adams et al. | 708/313 |
| 6,208,671 B1 | 3/2001 | Paulos et al. | 370/545 |
| 6,215,423 B1 | * 4/2001 | May et al. | 341/61 |

OTHER PUBLICATIONS

Analog Devices AD1896 192 kHz Stereo Asynchronous Sample Rate Converter, Analog Devices, Inc., 2001, pp. 1–24.
"Discrete–Time Signal Processing" by Alan V. Oppenheim and Ronald W. Schafer, Prentice–Hall International, Inc., 1989, pp. 102–115.

* cited by examiner

*Primary Examiner*—Howard L. Williams
(74) *Attorney, Agent, or Firm*—W. Daniel Swayze, Jr.; W. James Brady; Frederick J. Telecky, Jr.

(57) ABSTRACT

A digital sample rate converter converts a digital input signal (Din) having a first sample rate (Fs_in) to a corresponding digital output signal Dout having a second sample rate (Fs_out), wherein an upsampling circuit (3) upsamples the digital input signal (Din) by a factor of N and a feedback algorithm circuit (23A) receives a corresponding digital signal of the same sample rate (Fs_in*N) to produce a digital signal (X6) having a sample rate which is a second predetermined factor (M) times the second sample rate (Fs_out). That signal is filtered by a decimation filter (17) and then downsampled by a predetermined factor to produce the digital output signal (Dout) with the second sample rate (Fs_out).

25 Claims, 7 Drawing Sheets

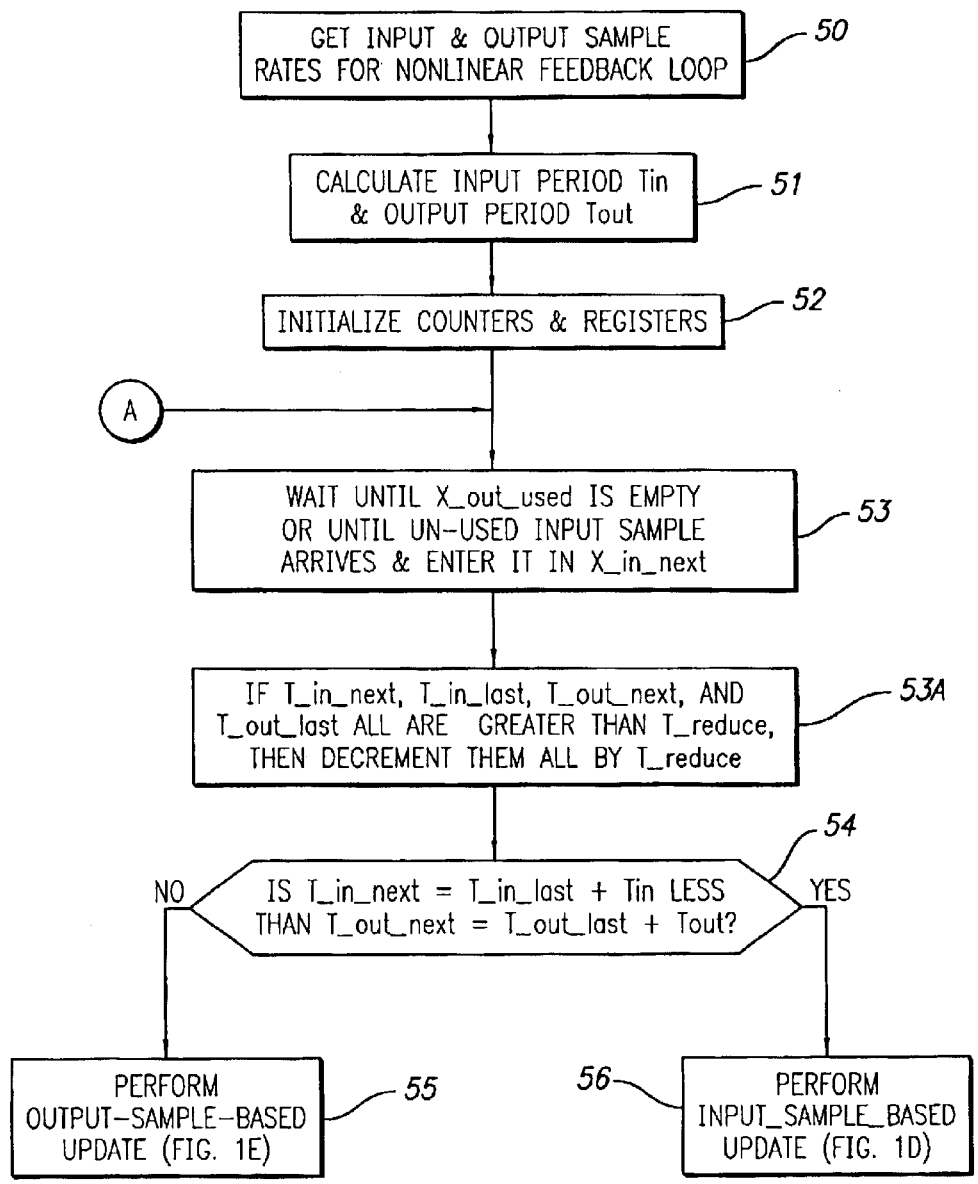

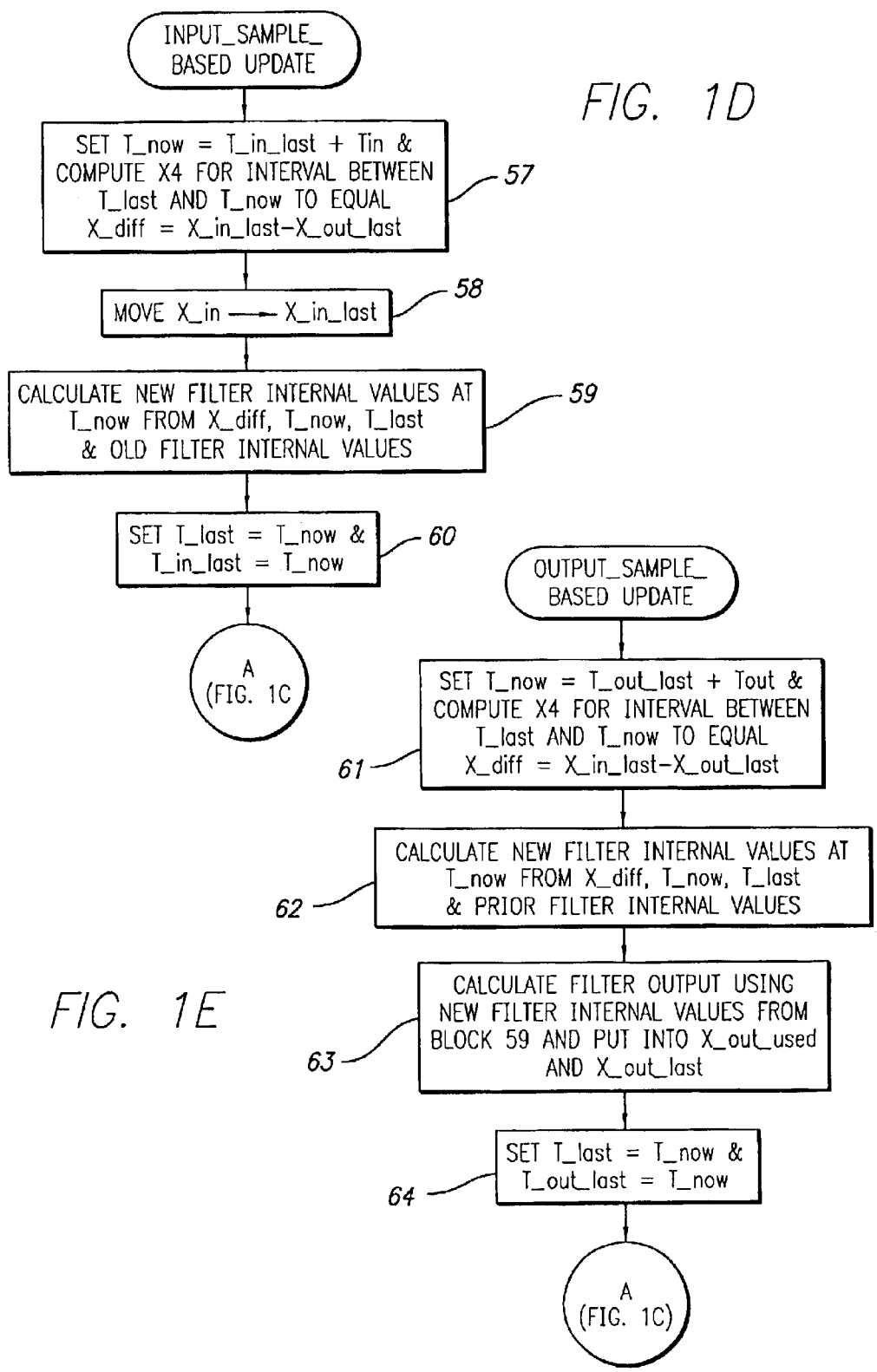

DIGITAL SAMPLE RATE CONVERTER ARCHITECTURE

BACKGROUND OF THE INVENTION

The present invention relates to digital sample rate converters (SRCs), and more particularly to improvements that reduce the amount of the computation required for the filtering and that improve the signal-to-noise ratio (SNR).

There are many applications in which is desirable to combine or mix a first stream of digital data (such as audio frequency data), which has been sampled at a first sample rate with a second stream of digital data that has been sampled at a second different sample rate and then digitally process the combined/mixed data. This cannot ordinarily be accomplished unless the sample rate of one of the two streams of digital data is converted by a digital sample rate converter to exactly match the sample rate of the other stream of digital data.

There are two primary known techniques for implementing digital sample rate converters (SRCs). The first and most common known technique involves sampling an input signal at an input rate, and then upsampling it by a first integer, performing appropriate anti-aliasing filtering, and then downsampling the filtered signal by a second integer to provide output data at the desired output sample rate. The integers used for determining up/down sampling factors are determined by the ratio of the output sample rate to the input sample rate, and may be large integers in some cases. The anti-alias filtering is needed to prevent images that are produced by the upsampling process from aliasing back into the desired passband of the output signal during the downsampling step. (in discrete-time signal processing, it is well known that images which are replicas of the main or fundamental signal are produced and become evident when a signal is upsampled. In effect, the images are versions of the original input signal frequency modulated by integer multiples of the original input sampling rate. For example, a signal that was initially sampled at 8 kHz and then was up-sampled by a factor of 4 to 32 kHz will have images of the input signal centered at 8 kHz and 16 kHz. Due to the cyclical, periodic nature of frequency in the discrete-time domain, images also appear at higher integer multiples of the input sampling rate.)

Implementations of sample rate converters using this approach typically take advantage of the upsampling and downsampling operations in order to reduce the amount of computation required by the anti-alias filtering. For example, assuming an upsampling integer equal to N, where N is greater than 1, the upsampled signal entering the anti-aliasing filter will have N−1 of every consecutive N samples equal to 0. Therefore, the filter implementation can avoid all summing or multiplying of these samples (i.e., the ones having a value of 0) with any other values, since the trivial result is already known. Assuming a downsampling integer is equal to M, where M is greater than 1, only 1 out of every M consecutive outputs from the filter will actually be used, and M−1 outputs of every M consecutive outputs will be discarded by the downsampling operation. Therefore, the amount of filter computation can be even further reduced by calculating only the outputs that will be used, but not calculating the outputs that will be eventually discarded. Taking advantage of both of these characteristics of a sample rate converter reduces the filter computation necessary without causing any modification to the effective signal processing actually being performed or to the final result.

The second known technique for implementing a digital SRC includes first upsampling an input signal to a very high rate and filtering it to reduce images. Then the point in time at which an output sample is required is calculated. This time-point generally falls between two values of the upsampled and filtered input. Next, an output sample is calculated by effectively "resampling" the upsampled and filtered input using a suitable formula, such as by linearly interpolating between two adjacent upsampled and filtered input samples to generate the output sample, based on the time-point of the output sample and the time-points of the adjacent upsampled and filtered input samples.

U.S. Pat. Nos. 5,475,628, 5,666,299, 6,141,671 and 6,208,671 disclose exceedingly complex sample rate conversion circuitry and techniques which are generally are illustrative of the known techniques for implementing asynchronous digital sample rate converters. Also see pp. 100–115 of the text "Discrete-Time Signal Processing" by Alan V. Oppenheim and Ronald W. Schafer, Prentice-Hall international, Inc. 1989. Also see the product specification sheet for the Analog Devices AD1896 192 kHz Stereo Asynchronous Sample Rate Converter.

There is an unmet need for an improved digital sample rate converter and method for reducing the amount of computation required for filtering operations.

There also is an unmet need for an improved digital sample rate converter and method wherein the amount of computation required to improve the signal-to-noise ratio of the sample rate converter is reduced.

There also is an unmet need for an improved digital sample rate converter and method wherein the amount of computation required for filtering operations is reduced and wherein the amount of computation required for improving the signal-to noise ratio of the sample rate converter is reduced.

There also is an unmet need for an improved digital sample rate converter and method which utilize digital arithmetic without use of any analog functions.

SUMMARY OF THE INVENTION

Accordingly, it is an object of the invention to provide an improved digital sample rate converter that reduces the amount of computation required for filtering operations.

It is another object of the invention to provide an improved digital rate sample converter that provides an improved signal-to-noise ratio.

It is another object of the invention to provide an improved digital sample rate converter that both reduces the amount of computation required for filtering operations and provides an improved signal-to-noise ratio.

It is another object of the invention to provide an improved digital sample rate converter and method which entirely utilize digital arithmetic, without use of any analog functions Briefly described, and in accordance with one embodiment thereof, the invention provides a method in for converting a digital input signal (Din) having a first sample rate (Fs_in) to a corresponding digital output signal (Dout) having a second sample rate (Fs_out), including upsampling the digital input signal (Din) by an integer N to produce a first digital signal (X1) having a third sample rate (Fs_in*N), filtering the digital signal (X1) to produce a filtered, upsampled second digital signal (X3), computing a first value of a third digital signal (X6) based on the second digital signal (X3), filtering the third digital signal (X6) to produce a fourth digital signal (X7), and downsampling the fourth digital signal (X7) by an integer M to produce the digital output signal (Dout) at the second sample rate (Fs_out). A time difference (td) between a most recent sample value of the second digital signal (X3) and a most recent sample value of the third digital signal (X6) is calculated, and then a subsequent value of the third digital signal (X6) is calculated based on a current value of the second digital signal (X3) and the time difference (td).

In a described embodiment, the invention provides a digital sample rate converter that converts a digital input signal (Din) having a first sample rate (Fs_in) to a corresponding digital output signal (Dout) having a second sample rate (Fs_out). The digital sample rate converter includes an upsampling circuit (3) for upsampling the digital input signal (Din) to produce a first digital signal (X1) having a third sample rate (Fs_in*N) and a feedback algorithm circuit (23A) which calculates a time difference (td) between a most recent input sample value representative of the first digital signal (X1) and a most recent output sample value (X6) of the calculating means and also processes the time difference (td) to compute a next value of the output signal (Dout). An interpolation filter (5) is coupled to an output of the upsampling circuit (3) and filters the first digital signal (X1) to produce a second digital signal (X3). The feedback algorithm circuit (23A) receives the second digital signal (X3) for filtering and sample rate conversion of the second digital signal (X3) in order to produce a third digital signal (X6) having a fourth sample rate (Fs_out*M) which is a second predetermined factor (M) times the second sample rate (Fs_out). A decimation filter (17) is coupled to an output of the feedback algorithm circuit (23A) for producing a fourth digital signal (X7) in response to the third digital signal (X6), and a downsampling circuit (19) is coupled to the decimation filter which downed samples the fourth digital signal (X7) by a factor of M to produce the digital output signal (Dout) at the second sample rate (Fs_out).

BRIEF DESCRIPTION OF THE DRAWINGS

FIGS. 1C–1E constitute a flow chart showing the steps of the feedback process implemented in the diagram of FIG. 1B.

DETAILED DESCRIPTION OF THE PREFERRED EMBODIMENTS

Figure 1A:
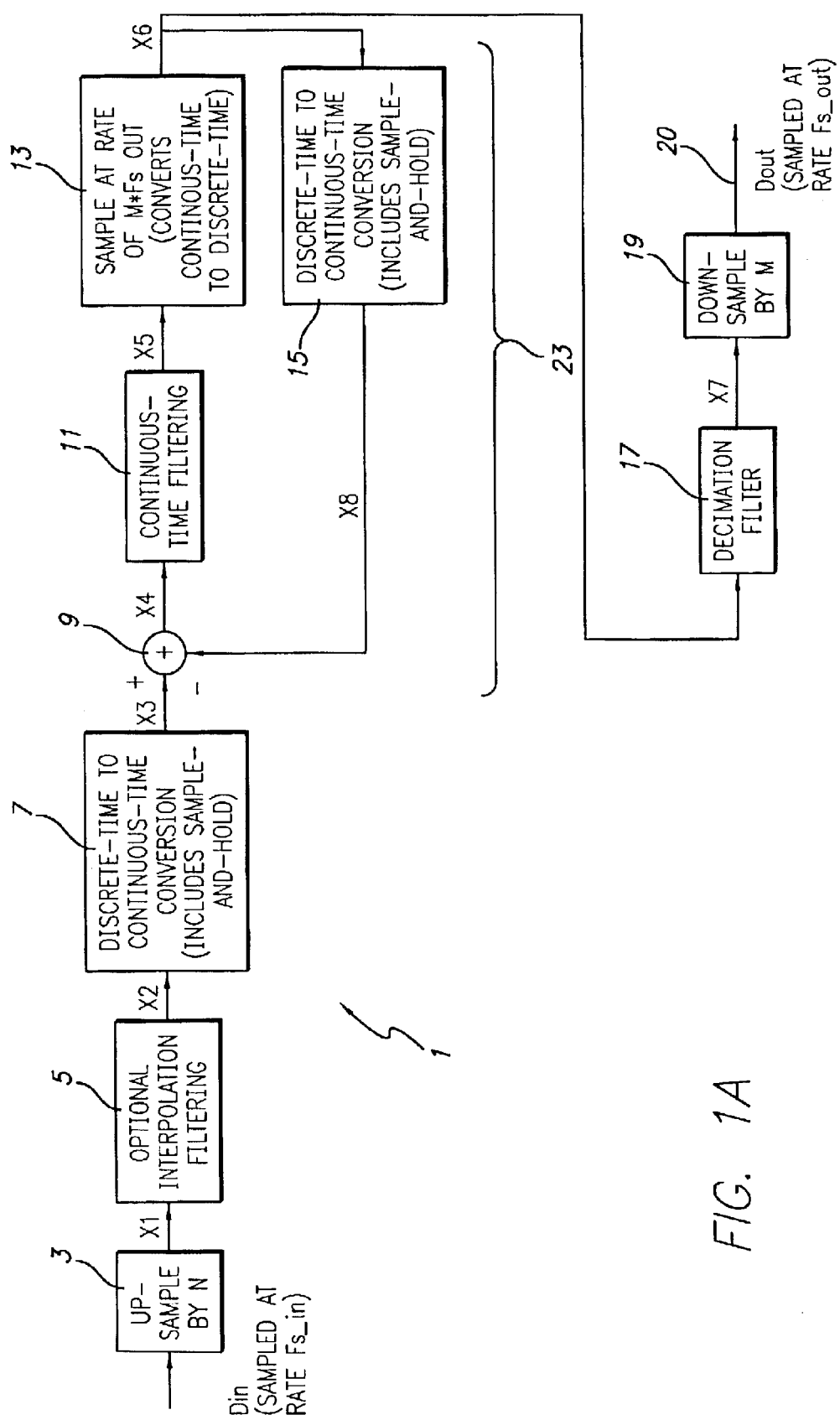
FIG. 1A is a block diagram of a generalized digital sample rate converter and is useful describing the concept of the present invention.

FIG. 1A shows a diagram of a digital sample rate converter 1. Referring to FIG. 1A, Din represents an input signal having an input sample rate of Fs_in. Din is applied to the input of an up-sampling circuit 3 that upsamples Din by an integer value N which may be 1 or more, to produce a sampled signal X1. If necessary, X1 is applied as an input to an interpolation filtering circuit 5 to remove images. Interpolation filtering circuit 5, if used, produces a filtered signal X2. X1 (or X2 if interpolation filtering circuit 5 is used) is applied to an input of a discrete-time to continuous-time conversion circuit 7, which includes sample-and-hold circuitry. Discrete-time to continuous-time conversion circuit 7 produces a continuous-time output signal X3, which is applied to the (+) input of a summing circuit 9 of a feedback circuit 23.

The output of summing circuit 9 produces a signal X4 that is piecewise-constant with respect to time. Piecewise-constant signal X4 is applied as an input to a continuous-time filtering circuit 11, which integrates X4 to produce a continuous-time signal X5. X5 is applied as an input to a sampling circuit 13 that samples the continuous-time signal X5 at a rate of M*Fs_out to produce a discrete-time signal X6. The above-mentioned feedback circuit 23 includes summing circuit 9, continuous-time filtering circuit 11, sampling circuit 13, and includes a discrete-time to continuous-time conversion circuit 15 that receives X6 as an input and produces a continuous-time signal X8, which is connected to a (−) input of summing circuit 9. Discrete-time to continuous-time circuit 15 includes a sample and hold function. The discrete-time signal X6 also is applied to the input of a decimation filter 17.

Decimation filter 17 operates as a low pass filter to produce a discrete-time signal X7, which is provided as an input to a down-sampling circuit 19 that down-samples X7 by a number M to produce an output signal Dout. Dout has a sample rate of Fs_out.

In operation, Din is up-sampled in up-sampling circuit 3 by an integer value N to generate a signal X1 that has a sample rate equal to N*Fs_in. (N may be 1 or larger, with N=1 meaning that no real upsampling is occurring.) The interpolation filtering of optional interpolation circuit 5 can be used to remove the above mentioned images that may be present. The interpolation filtering may be accomplished by means of a well-known sample-and-hold circuit or a zero-order hold circuit or by more complex circuitry to generate the signal X2. X2 also has a sample rate of N*Fs_in. In discrete-time to continuous-time conversion circuit 7, X2 is converted from discrete-time to continuous-time by means of a sample-and-hold operation to generate the continuous-time signal X3. This conversion and sample-and-hold operation is similar to the conversion performed by many prior-art digital-to-analog converters.

X3 then is applied as an input to feedback circuit 23, which is subsequently described in more detail. The output of feedback circuit 23 is the discrete-time signal X6, which has a sample rate of M*Fs_out, where Fs_out is the desired output sample rate. X6 then is filtered in decimation filter 17 and then down-sampled by a factor of M in down-sampling circuit 19 to provide the final output data Dout at the desired output sample rate Fs_out. This second filtering operation (by decimation filter 17) is performed to remove high frequency components so they are not aliased back into the desired output signal passband during the down-sampling-by-M step. (It should be recognized that the ratio of the output sample rate to the input sample rate is not necessarily equal to N/M.)

Feedback circuit 23 includes analog summer 9, which subtracts the continuous-time feedback signal X8 that is produced by discrete-time to continuous-time conversion circuit 15 in response to X6. The output X5 of continuous-time filtering circuit 11 is sampled by continuous-time to discrete-time conversion circuit 13 at a rate of M times the desired output rate, i.e., M*Fs_out, to produce X6. X6, which now is in the discrete-time domain, is the output of feedback circuit 23 and is passed forward to decimation filter 17, outside of the feedback loop. Decimation filter 17 has a sharp cut off. For example, if the pass band is 20 Hz to 20 kHz, the sharp cut off transition might be from 20 kHz to 22 kHz so that the attenuation of decimation filter 17 beyond 22 kHz might be roughly 120 to 148 dB. X6 also is converted inside the feedback loop by discrete-time to continuous-time conversion circuitry 15 by means of sample-and-hold circuitry to generate the continuous-time feedback signal X8 that is subtracted from X3 to produce the piecewise-constant signal X4. This is accomplished by means of sample-and-hold circuitry (not shown) in discrete-time to continuous-time conversion circuitry 15.

The key to the operation of digital sample rate converter circuit 1 as shown in FIG. 1A is the structure and operation of feedback circuit 23, which is similar to the structure and operation of a continuous-time delta-sigma modulator. However, a difference between digital sample rate converter circuit 1 and a typical continuous-time delta-sigma modulator is that digital sample rate converter circuit 1 converts a signal from one sample rate to another sample rate by, in effect, going through continuous-time operations within the feedback loop 23, rather than by converting a signal from analog to digital.

It should be understood that the implementation of digital sample rate converter circuit 1 shown in FIG. 1A is more useful for understanding the basic ideas of the invention than in actually providing an practical implementation. This is because in the preferred practical implementation shown in subsequently described FIG. 1B, discrete-time signals are not actually physically converted to continuous-time. Instead, the values of only certain continuous-time signals are calculated within the feedback loop at certain time-points. Since no continuous-time signals need to be actually passed into or out of any of the circuitry in FIG. 1B, there is no need to actually generate any truly continuous-time signals therein.

The feedback circuit 23 of FIG. 1A is intended to cause the signal X8 to be virtually the same as signal X3 within the signal bandwidth of interest. In order for this to occur, it is necessary that the sampling rate of X6 be significantly greater than twice the signal bandwidth of interest (i.e., the Nyquist rate). In other words, over-sampling is needed, which is common in most delta-sigma modulator systems. This is why decimation filter 17 and down-sample-by-M circuit 19 are needed after feedback circuit 23 to reduce the sample rate of Dout down to the desired sample rate Fs_out.

It should be appreciated that the continuous-time filtering performed in block 11 of feedback circuit 23 may take many forms and may have many signal processing transfer functions, and still result in satisfactory operation. One simple technique would be to provide the continuous-time filtering in block 11 by in effect implementing the transfer function written as a Fourier transform of the continuous-time impulse response as $$X5(s)=X4(s)\cdot K1/s \quad \text{(Equation 1)},$$

which is a simple integrator with scalar gain K1, where X4(s) is the Fourier transform of X4(t), etc. If the sampling block 13 between signals X5 and X6 and the discrete-time to continuous-time conversion in block 15 between signals X6 and X8 are assumed to be unity-gain blocks to the signal passing through (although this is not a strictly correct assumption), then the complete feedback circuit 23 has a transfer function given by $$X8(s)/X3(s)=K1/s+K1 \quad \text{(Equation 2)},$$

which is a single-pole lowpass filter with a −3 dB frequency at $$f_{pole}=K1/2\pi \quad \text{(Equation 3)},$$

in Hertz.

It can be assumed that X6 is now a discrete-time version of X3 in the signal bandwidth of interest (although this is not strictly correct), so X6 has roughly the same content in the signal band as X3 would have after being filtered by the above single-pole lowpass filter.

As mentioned above, it is not necessary to actually implement any true continuous-time circuitry within continuous-time filtering block 11 in feedback circuit 23. Instead, it is only necessary to calculate the output X5 of block 11 and, depending on the type of filtering being done, to also calculate some other necessary values internal to the continuous-time filtering block 11 at certain necessary discrete time-points.

This can be easily accomplished because of the characteristics of the input signal X4 applied to continuous-time filter 11, i.e., because of the characteristics of X4 which is equal to X3–X8. Note that X3 in FIG. 1A is the result of a discrete-time to continuous-time conversion by means of sample/hold circuitry included in block 7. Therefore, X3 is a piecewise-constant signal with respect to time. Similarly, X8 is the output of another discrete-time to continuous-time conversion by means of sample/hold circuitry included in block 15, and also is a piecewise-constant signal with respect to time. When X8 is subtracted from X3 to generate X4, this means that X4 also is a piecewise-constant signal with respect to time.

Note, however, that the time-points at which X3 changes value and the time-points at which X8 changes value are not synchronized. In fact, the time-points are related to entirely separate clock signal domains, since Fs_in and Fs_out are independently selected. For example, assume that N=1 and X3 changes at a Fs_in sample rate, while X8 changes at an M*Fs_out sample rate. Then, although X4 is piecewise constant, the time-points at which it changes do not occur with a fixed period. This means that the implementation must be sufficiently sophisticated to determine the time-points at which X4 changes value and calculate the necessary values at those time-points. As subsequently explained, this can be accomplished in a practical manner.

To prove the workability of the digital sample rate converter 1 shown in FIG. 1A, a version of that system was implemented, i.e., simulated, using custom C-code. In the C-code implementation, the value of K1 was set to $2\pi 100$ kHz, thus settings $f_{pole}$ to 100 kHz. The C-code was written to more closely model how an actual circuit implementation would be constructed. That is, in the C-code implementation the value of the integrator output was calculated only at particular time points at which the signal X4 potentially changes value. For this, values were selected of M=128, N=1, Fs_in=44.1 kHz, and Fs_out=48 kHz. However, no decimation filtering was included in the C-code, so X6 was used as the simulation output Dout at a rate of 128*48 kHz.

Figure 2:
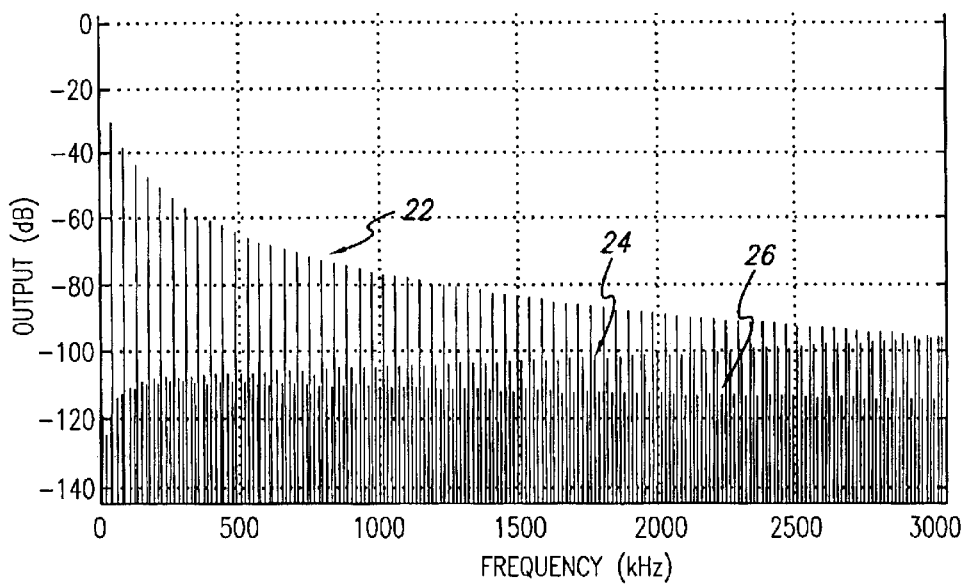
FIG. 2 is a diagram of the output spectrum of the signal X6 in FIG. 1B with a 1.5 kHz input sine wave with a 44.1 kHz sample rate which is converted to an output signal with a 128*48 kHz output sampling rate.

The resulting spectral output of X6 is shown in the graph of FIG. 2, wherein a 1.5 kHz input sinewave applied as an input at a 44.1 kHz sampling rate was converted to a 128*48 kHz output sampling rate, with the intention that decimation filtering would follow to reduce the sample rate to a final 48 kHz output sampling rate.

Figure 3:
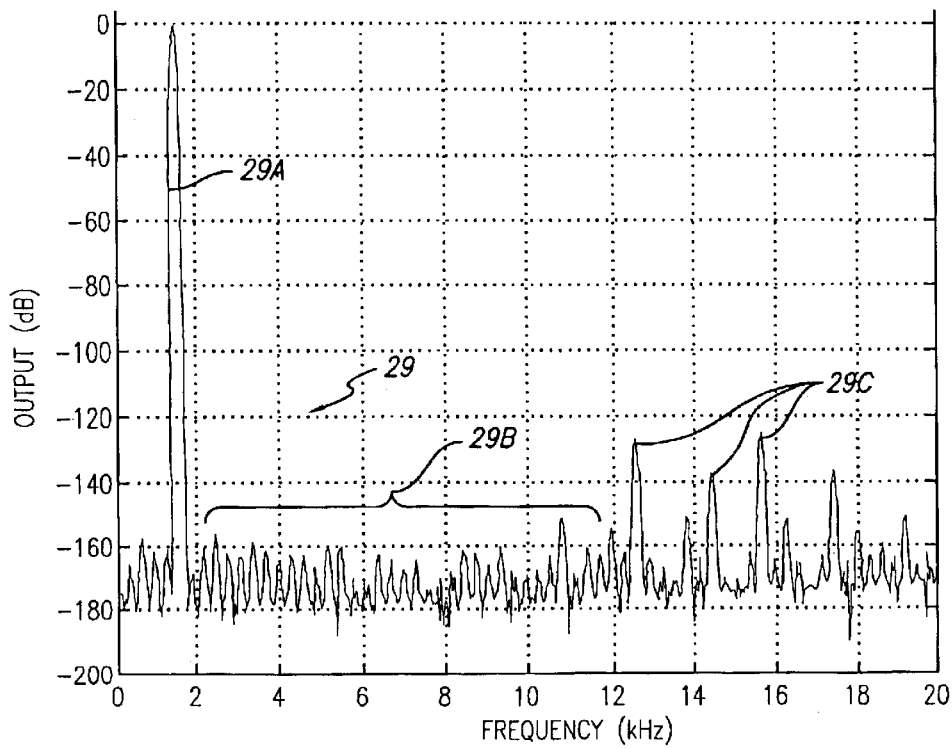
FIG. 3 is a diagram of is an expanded diagram of a portion of the output spectrum shown in FIG. 2.

In FIG. 3, the fundamental signal component can be seen at the far left as a single impulse at 1.5 kHz, very close to the left axis. The remaining impulses are images of the original input signal that are aliased due to the sampling operation that occurs in block 13 of FIG. 1A. It should be noted that the aliased images very close to DC can be seen rolling downward as they get closer to DC. This is due to the spectral shaping that occurs due to the position in the structure at which the sampling aliasing occurs and the frequency response from that point to the output at X6 in FIG. 1A.

The resulting spectral output at X6 is also shown in FIG. 3, with the horizontal axis "zoomed" into an assumed audio signal band of 20 Hz–20 kHz. In FIG. 3, the large-amplitude "spike" 29A represents the 1.5 kHz input frequency. The other spectral lines 29B and 29C all have amplitudes less than approximately −120 dB, and represent aliased images of the original input signal that have been attenuated by the spectral shaping which results from the structure shown in FIG. 1A. The above described simulation shows that this spectrum over the signal passband of 20 Hz–20 kHz has a signal-to-noise ratio (SNR) equal to 121 dB, which is a much higher value than can be achieved by the prior art using simple first-order filtering before decimation.

Figure 4:
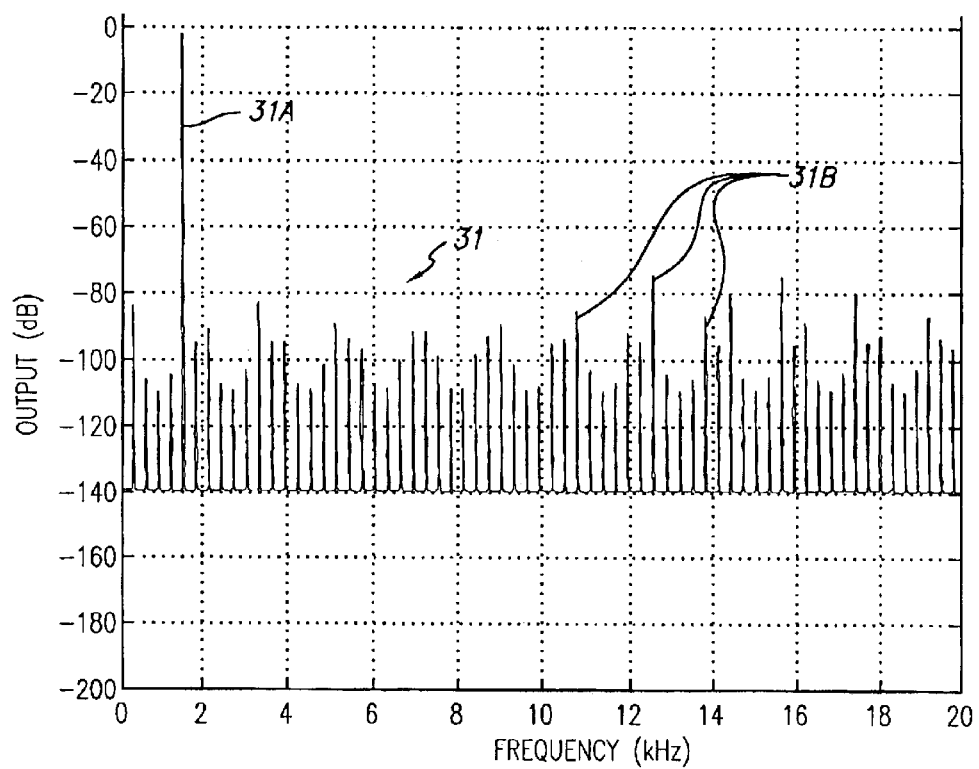
FIG. 4 is a diagram of the spectral output of a conventional sample rate converter.

For example, the above high signal-to-noise ratio result compares very favorably to that of the conventional simplistic approach of up-sampling the 44.1 kHz input data by means of sample-and-hold circuitry to 128*160*44.1 kHz, then down-sampling by 147 to an output rate of 128*48 kHz. The output spectrum from the above mentioned conventional simplistic approach is shown in FIG. 4, which is "zoomed in" on the 20 Hz–20 kHz audio signal band, and shows the output spectrum for a 1.5 kHz sinewave sampled at 44.1 kHz that is up-sampled by 128*160*44.1 kHz with sample-and-hold, then downsampled by 147 to 128*48 kHz. This data achieves a much lower SNR of only 67 dB over the 20 Hz–20 kHz signal band.

As is well known in the area of delta-sigma modulators, a higher over-sampling ratio and/or higher order filtering within the loop can greatly improve performance versus use of a single integrator, when considering the system's attenuation of components (such as quantization noise, in case of delta-sigma modulators) injected after the integrator but before the output. In the present invention, the over-sampling ratio can be considered to be the ratio of the rate at which the part of the feedback path conducting X8 actually operates relative to twice the signal band frequency, which here would be (128*48 kHz)/(2*20 kHz)=153.6. Another option for improving the performance of the first-order system shown in the example above is to include the optional interpolation filtering, which will reduce the amplitude of some images produced by the interpolation process.

Figure 5:
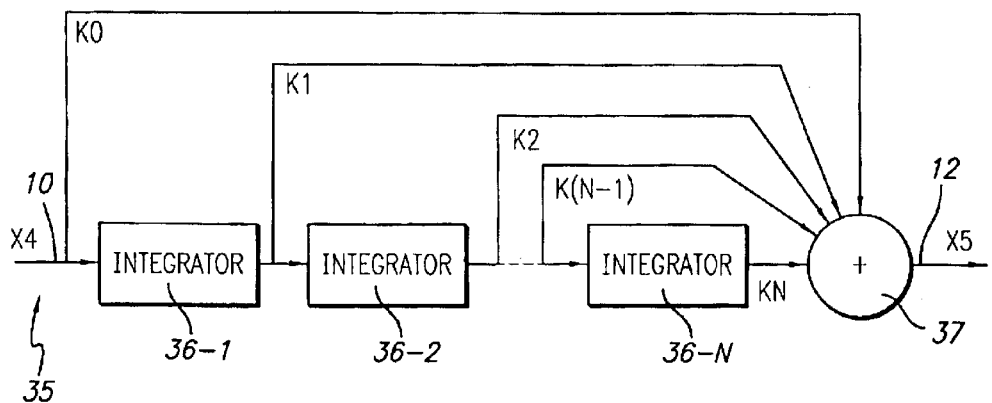
FIG. 5 is a block diagram of a scalable architecture suitable for implementing the continuous-time filtering function of block 11 of FIG. 1A.

While the above example demonstrates the use of a single integrator within the continuous-time filtering block 11, it is also possible to extend the above described technique to a higher order system containing more integrators. One possible structure for such a scalable approach is shown in FIG. 5, which shows a scalable architecture for implementing the continuous-time filtering block. Referring to FIG. 5, the continuous-time filtering circuit 11 in FIG. 1A can include a higher-order filter 35 including N integrators 36-1, 36-2 . . . 36-N and a summer 37. X4 on bus 10 is applied to an input of integrator 36-1 and also is applied as a coefficient K0 to an input of summer 37. The output K1 of integrator 36-1 is a coefficient that is applied as an input to integrator 36-2 and is applied to another input of summer 37. Similarly, the output of each integrator is applied as an input to the next integrator also and to a corresponding input of summer 37, and the output of the last integrator 36-N is applied to the last input of summer 37, which produces X5 on bus 12. However, it should be understood that there are many other ways to implement the filtering required in block 11 of FIG. 1A, and the choice depends upon the trade-off between the needed filtering performance and the cost.

As higher order filtering is implemented, the equations for calculating the state of the integrator at the discrete time points when X4 changes become more complex. However, such equations are easily derived. The equations for a second order system were implemented in similar fashion to the implementation of the first order system described above, calculating only integrator values at discrete time-points at which X4 changed value. The system transfer function was approximated as a second order Butterworth filter with a 100 kHz cutoff frequency, which yielded coefficients of K0=0, K1=888576.5876, and K2=3.94784176× $10^{11}$ (with no other K values being used). A similar 1.5 kHz sinewave input signal with a sample rate of 44.1 kHz was applied as the signal input to the system implemented in this manner, and the resulting X6 signal was monitored.

Figure 6:
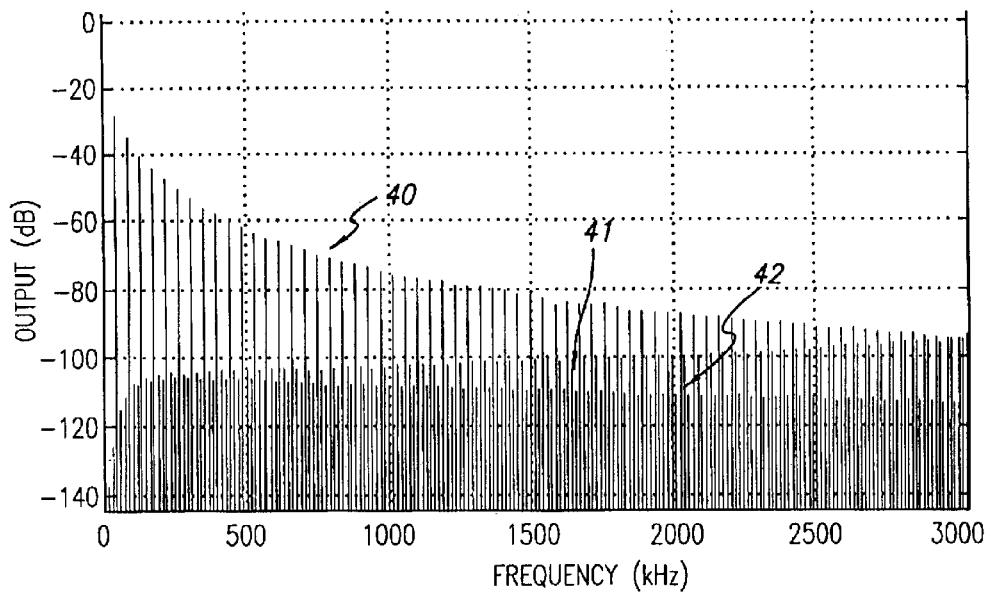
FIG. 6 is a diagram of the spectral output of the sample rate converter of FIG. 1B with a second order filter system, produced in response to a 1.5 kHz sinewave with a 44.1 kHz sample rate and producing the signal X6 with a 128*48 kHz sample rate.
Figure 7:
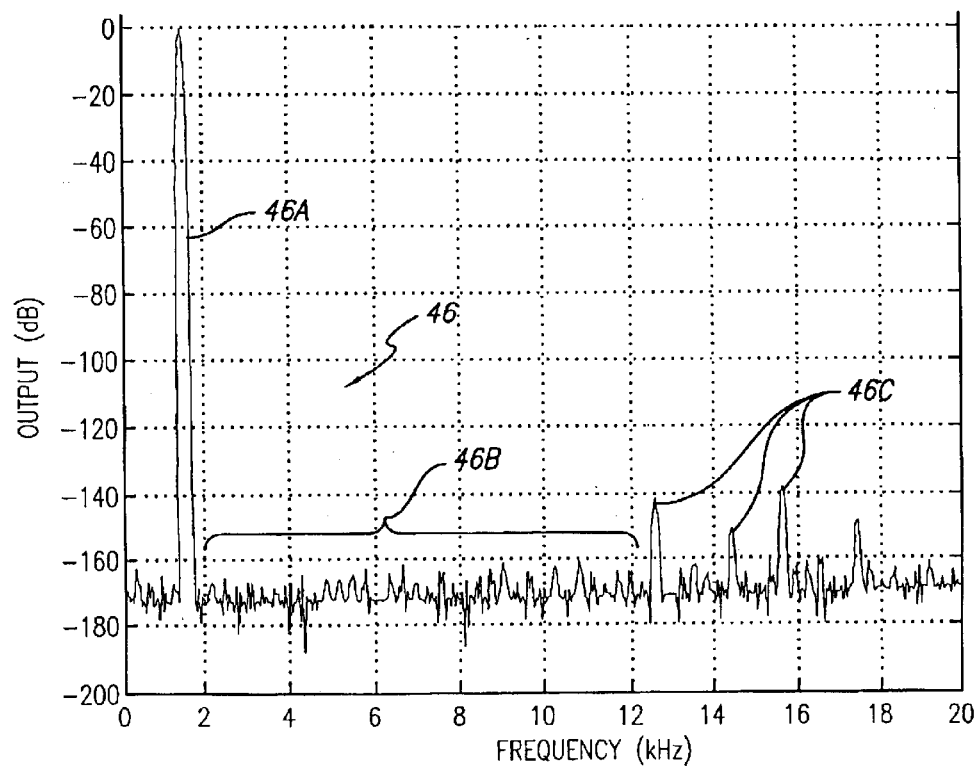
FIG. 7 is a diagram of an expanded portion of the spectral output shown in FIG. 6.

FIG. 6 shows the spectral output of the second order system, with the 1.5 kHz sinewave input sampled at 44.1 kHz applied as the input, and the resulting output X6 was sampled at 128*48 kHz. FIG. 7 shows a zoomed-in view of the data in FIG. 6. This case resulted in an even higher SNR over the 20 Hz–20 kHz band of 135 dB, a 14 dB improvement from the first-order result. Note that the images occur at the same frequencies as in the output of the previous example (shown in FIGS. 2 and 3). However, referring specifically to the zoomed-in spectral diagrams (FIG. 3 versus FIG. 7), note that the aliased images that have landed in the signal bandwidth of 20 Hz to 20 kHz are attenuated more in FIG. 7, due to the second order versus first-order filtering.

Figure 1B:
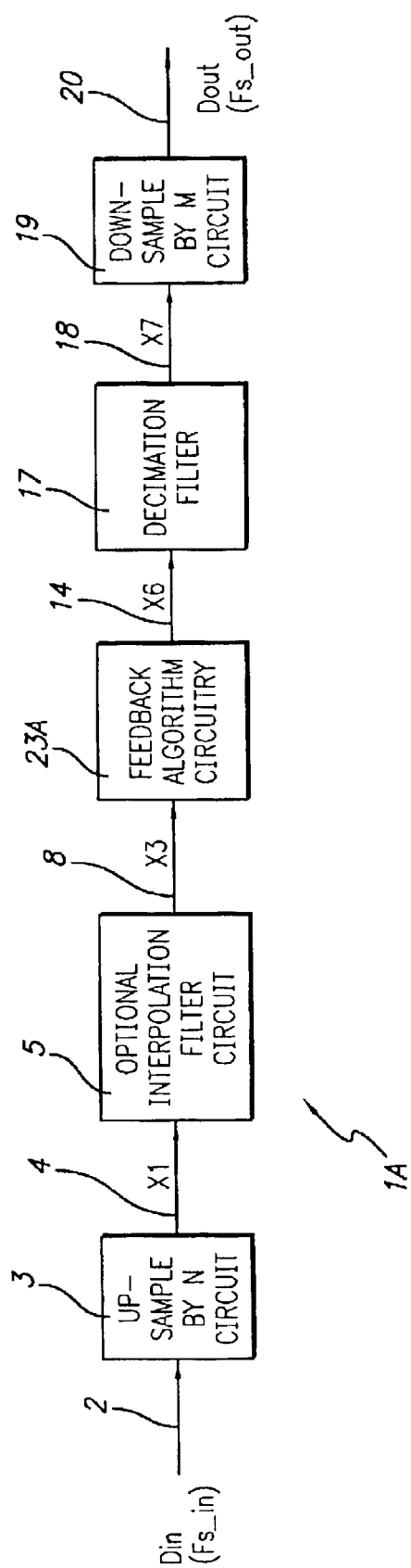
FIG. 1B is a block diagram of a practical integrated circuit implementation of the digital sample rate converter shown in FIG. 1A.

Referring next to FIG. 1B, a block diagram of a practical integrated circuit implementation 1A of the digital sample rate converter 1 of FIG. 1A is shown, wherein the function of feedback loop 23 is in effect implemented by a feedback algorithm circuit 23A such that computations of Dout are made only at time-points which are needed, i.e., time-points at which X4 of FIG. 1A changes. In FIG. 1B, Din on input bus 2 has an input sample rate of Fs_in. Din is applied to the input of up-sampling circuit 3, which upsamples Din by an integer value N to produce the signal X1 on bus 4. If desired, X1 is applied as an input to an interpolation filtering circuit 5 to remove images. Interpolation filtering circuit 5, if used, produces a filtered signal X3 on bus 8. X1 (or X3 if interpolation filtering circuit 5 is used) is applied to an input of feedback algorithm circuit 23A, which produces the same discrete-time signal X6 as is produced by the sample rate converter 1 of FIG. 1A. X6 is applied to the input of decimation filter 17. As in FIG. 1A, decimation filter 17 operates as a low pass filter to produce a discrete-time signal X7 on bus 18, which is provided as an input to a downsampling circuit 19 that down-samples X7 by a number M to produce an output signal Dout on bus 20. Dout has a sample rate of Fs_out.

As in FIG. 1A, Din is up-sampled by integer value N to generate the signal X1 with a sample rate equal to N*Fs_in, and if optional interpolation filter 5 is used, its output signal X3 has the same sample rate of N*Fs_in. In practice, if optional interpolation filter 5 is not used, then an upsample ratio of N=1 will be normally preferred.

Feedback algorithm circuit 23A performs the process shown in the flowchart of FIGS. 1C–1E, such that the signal X6 has a sample rate of M*Fs_out, where Fs_out is the desired output sample rate.

As previously mentioned, the values of only certain continuous-time signals are calculated at certain time-points within the feedback loop that is implemented by feedback algorithm circuit 23A. Since no continuous-time signals need to be actually passed into or out of any of the circuitry in FIG. 1B, there is no need to actually generate any truly continuous-time signals at all, and the digital sample rate converter circuit 1A of FIG. 1B is an all-digital circuit that produces exactly the same Dout at Fs_out as would be obtained with a circuit shown in FIG. 1A.

The process performed in block 23A of FIG. 1B will be described next.

Referring to the flowchart of FIGS. 1C–E, the first step in the feedback algorithm is to obtain input sample rates and output sample rates for the nonlinear feedback loop, as shown in block 50. This step is performed after any interpolation filtering that is performed by interpolation filter circuit 5, and before any decimation filtering by decimation filter 17. I.e., the step of block 50 is performed using either X1 or X3 (depending on whether interpolation filter circuit 5 is used) as the input to feedback algorithm circuitry 23A, and also using X6 as the output of feedback algorithm circuitry 23A. The input sample rates and output sample rates can be determined by suitable circuitry or provided from an external source. Next, the feedback algorithm goes to block 51 and calculates the input period Tin and output period Tout. Then the algorithm goes to block 52 and initializes various counters and registers.

Referring to block 53, the feedback algorithm then waits until a digital output buffer register X_out_used is empty or an input sample has arrived that has not been used yet. When an input sample arrives, it is placed into a digital buffer register X_in_next. For convenience, the definitions of the registers and timepoints used in the flowchart of FIGS. 1C–E will be set forth now, as follows.

X_out_used and X_in_next can be thought of as digital buffers. X_out_used holds an output value to be used next by the system (i.e., by feedback algorithm circuit 23A), which uses an output value every 1/(output sampling rate M*Fs_out) interval. When the value in X_out_used is used by the system, this buffer becomes empty. X_in_next can similarly be thought of as a digital input buffer, into which the system places a new input value at a rate of one every 1/(input sampling rate N*Fs_in) interval. T_in_next is effectively a time variable that indicates the time when the next input sample value is expected to arrive. T_in_last is similarly a time variable that indicates the time when the immediately previous input sample value was calculated to arrive. T_out_next is similarly a time variable that holds the time when the next output sample value is expected to be generated, and T_out_last is a time variable that holds the time when the immediately previous output sample value was calculated as being generated. Assuming all time variables start at some zero initial value, it is generally expected that T_in_next is equal to T_in_last plus one input sample rate period, and similarly T_out_next=T_out_last+one output sample rate period. It should also be noted that it is not critical that the time variables be accurate in absolute time, only relative to each other.

Referring to block 53A of FIG. 1C, in order to avoid the time variables growing to larger and larger values as processing continues, all counters are periodically reduced by a fixed value T_reduce, thus keeping their values relative to each other the same, but preventing their absolute values from increasing unbounded. T_reduce is chosen such that it is significantly larger than the maximum values of 1/(input sampling rate) and 1/(output sampling rate) expected, but small enough to limit the time variables to reasonable ranges of values.

The feedback algorithm in block 23A then goes to decision block 54 and evaluates whether the next timepoint is an input sample transition or an output sample transition. This is done by computing T_in_next=T_in_last+Tin and T_outnext=T_out_last+Tout, and then determining which is the lower value. If T_in_next is less than or equal to T_out_next, the feedback algorithm goes to block 56 and performs the input-sample-based update operation shown in the flowchart of FIG. 1D. Otherwise, the feedback algorithm goes to block 55 and performs. the output-sample-based update operation shown in the flowchart of FIG. 1E.

Referring to FIG. 1D, if the determination of decision block 54 is affirmative, the feedback algorithm begins the input-sample-based update by entering block 57 and sets T_now=T_in_last+Tin, and then calculates the value of a signal corresponding to the summer output X4 in FIG. 1A as X_diff=X_in_last−X_out_last, over the interval of time between T_last and T_now. Then the feedback algorithm goes to block 58 and moves the contents of a register X_in into a register X_in_last. Register X_in holds the input sample value that corresponds to the timepoint T_in_last+Tin=T_now.

The feedback algorithm then goes to block 59 and calculates filter internal values at the timepoint T_now using X_diff, the value of T_now, the value of T_last, and previous filter internal values. (In the subsequently described equations, this would be the values of the equations y1(t), y2(t), etc., at time t=T_now=T(n+1), T(n)=T_last, L(n)=X_diff). Next, the feedback algorithm goes to block 60 and sets T_last=T_now and also sets T_in_last=T_now, and then goes to label A of FIG. 1C in order to implement the feedback conceptually shown as X8 in FIG. 1A.

However, if the determination of decision block 54 is negative, the feedback algorithm of block 23A goes to block 61 of FIG. 1E to begin the output-sample-based update operation. In block 61, the feedback algorithm sets T_now=T_out_last=Tout and calculates the value of a signal corresponding to the summer output X4 in FIG. 1A as X_diff=X_in_last−X_out_last, over the interval of time between T_last and T_now. The feedback algorithm then goes to block 62 and calculates filter internal values at timepoint T_now using X_diff, the value of T_now, the value of T_last, and previous filter internal values. (In the subsequently described equations, this would include evaluation of the equations y1(t), y2(t), etc., at time t=T_now=T(n+1), T(n)=T_last, L(n)=X_diff). The feedback algorithm then goes to block 63 and calculates a value corresponding to the filter output X5 in FIG. 1A (or the filter output X6 in FIG. 1B) using the filter internal values previously computed in block 59 of FIG. 1D, and puts this into the output sample register X_out_used and also into register X_out_last.

The feedback algorithm then goes to block 60 for a FIG. 1E and sets T__last=T__now, and also sets T__out__last=T__now. The feedback algorithm then goes to label A of FIG. 1C in order to implement the feedback conceptually shown as X8 in FIG. 1A.

Note that the foregoing description assumes that the "input sampling rate" is N*Fs__in and the "output sampling rate" is M*Fs__out, so M and N do not appear in the blocks of the flowchart of FIGS. 1C–E. Note also that the processes in the blocks 59 and 63 are basically described in detail in the equations below.

As an intuitive understanding of how this system works conceptually to keep X8 of FIG. 1A close to X3, it might be helpful to think of summing circuit 9 as an analogous to an operational amplifier wherein the (+) and (−) inputs are forced to be equal to each other by the feedback operation. In this case, the (+) input is X3 and the (−9) input is X8, and the feedback operation forces them to be approximately equal. This needs to be the case in the signal band, so if X8 is approximately equal to X3, and X8 is generated from X6, then X6 must be approximately equal to X3 as well. And ultimately in the rate conversion, the output X6, and eventually Dout, should be equal to X3 in the signal band of interest, so that the rate conversion is accomplished without extra artifacts being introduced or aliased back. The signal band of interest is approximately from DC to one half of Fs__out.

Note that a separate state machine runs continually to pass output values X5 out of the feedback loop. This state machine waits until an output sample is required, and when an output sample is required, passes X__out__used to the next stage of circuitry, and then clears X__out__used, and then repeats the operation.

Next, the mathematics is described for calculating the values of the integrator outputs based on an input X4 that is piecewise-constant, changing at discrete timepoints (which are not necessarily periodically spaced).

Assume the input to the series of integrators is x(t), where x(t) is piecewise-constant over varying length time intervals. In the example described above, x(t) is represented by the signal X4. The discrete vector T(n) is defined as a vector of time-points at which x(t) changes value. The vector L(n) is defined as the level of x(t) over the time interval $T(n) \leq t < T(n+1)$. Therefore, it can be said that x(t) has value L(n) from time t=T(n) until just before t=T(n+1). Note that n is an integer that serves as a vector index.

Next, $y_1(t)$ is defined as the output of the first integrator, $y_2(t)$ is defined as the output of the second integrator, etc. Several general expressions can be written:

$$x(t)=L(n), \; T(n) \leq t \leq T(n+1) \quad \text{(Equation 4)}$$

$$y1(t)=L(n)t+[y1(T(n))-L(n)T(n)], \; T(n) \leq t \leq T(n+1) \quad \text{(Equation 5)}$$

$$y2(t)=[\tfrac{1}{2}L(n)t^2]+[y1(T(n))-L(n)T(n)]t+[y2(T(n))-y1(T(n))T(n)+\tfrac{1}{2}L(n)T(n)^2], \; T(n) \leq t \leq T(n+1), \quad \text{(Equation 6)}$$

$$y3(t)=[\tfrac{1}{6}L(n)t^3]+\tfrac{1}{2}[y1(T(n))-L(n)T(n)]t^2+[y2(T(n))-y1(T(n))T(n)+\tfrac{1}{2}L(n)T(n)^2]t+[y3(T(n))-\tfrac{1}{6}L(n)T(n)^3-y2(T(n))T(n)+\tfrac{1}{2}y1(T(n))T(n)^2], T(n) \leq t \leq T(n+1). \quad \text{(Equation 7)}$$

The foregoing equations can be integrated further to yield equations for more integrator outputs, for 4th and higher order systems. Note that the foregoing equations for the integrator outputs use time variables, the level of the input signal, and integrator outputs only at previous discrete time-points, but not at any other times between these time-points. Thus, the foregoing integrator equations need evaluation only at the discrete time-points to calculate future integrator values at later time-points.

In the example described above, these equations would be used with T(n+1)=T__now, T(n)=T__last, and the y1, y2, etc., values would be calculated at T__now (i.e., y1(T__now), y2(T__now), etc.).

As previously indicated, a conventional approach to implementing digital sample rate converters is to determine the ratio of the input sample rate to the output sample rate, then up-sample the input by a first integer A, perform an image filtering operation, and then down-sample by a second integer B. The resulting output sample rate then is the input sample rate times the ratio A/B. In typical implementations, the image filtering is performed as efficiently as possible, calculating only the values that are actually needed at the output after decimation by the integer B, rather than calculating the values for every value of the output at the high intermediate rate. As the ratio A/B changes, the image filtering needed in the conventional approach also must change to sufficiently filter the images so there is no significant aliasing into the signal band.

In contrast, the present invention instead embeds a sampler within a feedback loop, and uses oversampling and the benefits of negative feedback to help remove images. A final decimation filter is still needed at the output, but now it can be a fixed architecture with fixed coefficients, only needing to change speed with the speed of the desired output sample rate, but no coefficient changes are necessary. The use of the sampler embedded within the feedback loop provides a more efficient implementation than the conventional methods in cases where the ratio of input sample rate to output sample rate covers a broad range, and where fine resolution is required. Also, the present invention avoids the requirement of some conventional methods that require different filter coefficients in different ranges, and also avoids the calculation of new filter coefficients internally (rather than storing multiple coefficient sets) that is required in some implementations of the conventional methods. This requirement of some of the conventional sample rate converters necessitates even more computation, making the resulting implementation more complex and less efficient.

The present invention is expected to be especially useful for audio data, although it could be used in many other applications wherein sampled time-domain data is used and sampling rate conversion is needed. It is expected to be implemented using standard digital logic, without use of analog circuitry.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims. For example, more exact mathematical expressions are known and could be used in an implementation of the disclosed invention.

It is also possible that an equivalent system could be implemented by shifting the differencing operation shown in block 9 FIG. 1A to a time after some or all of the continuous-time filtering referred to in block 11 of FIG. 1A. One example of this would be, assuming a continuous-time filtering block like that shown in FIG. 5, to replace the first integrator 36-1 with two parallel integrators, one of which would integrate the signal X3, the second of which would integrate the signal X8, and then subtract the two integrator outputs to calculate effectively the same value as the output of integrator 36-1. In this case, the differencing referred to in block 9 would not subtract X8 from X3 any longer; the differencing would instead occur after the two parallel integrators. Some extra calculation would also be needed to monitor if the values of the two parallel integrator were exceeding some maximum value, and if so, reducing both integrator values by the same amount. Similarly, monitoring would be needed in order to determine if the values of the two parallel integrators were more negative than some minimum negative value, and if so, increasing both integrator values by the same amount. This would not alter the difference result that is calculated at all, but it would prevent the range of the integrator values from increasing unbounded in either the positive or negative direction.

What is claimed is:

1. A digital sample rate converter for converting a digital input signal having a first sample rate to a corresponding digital output signal having a second sample rate, comprising:
   (a) an upsampling circuit for upsampling the digital input signal to produce a first digital signal having a third sample rate which is a first predetermined factor times the first sample rate;
   (b) a feedback algorithm circuit receiving a second digital signal which is representative of the first digital signal and has the third sample rate for filtering and rate conversion of the second digital signal in order to produce a third digital signal having a fourth sample rate which is a second predetermined factor times the second sample rate;
   (c) a decimation filter for producing a fourth digital signal in response to the third digital signal; and
   (d) a downsampling circuit coupled to the decimation filter for downsampling the fourth digital signal by a predetermined factor to produce the digital output signal having the second sample rate.

2. The digital sample rate converter of claim 1 wherein the feedback algorithm circuit generates the third digital signal to precisely match the second digital signal in a signal band of interest.

3. The digital sample rate converter of claim 2 wherein the signal band of interest is approximately between DC and one half of the second sample rate.

4. The digital sample rate converter of claim 2 wherein each of the upsampling circuit, the feedback algorithm circuit, the decimation filter, and the downsampling circuit is an all-digital circuit.

5. A digital sample rate converter for converting a digital input signal having a first sample rate to a corresponding digital output signal having a second sample rate, comprising:
   (a) an upsampling circuit for upsampling the digital input signal to produce a digital first signal having a third sample rate which is a first predetermined factor times the first sample rate;
   (b) a feedback algorithm circuit receiving a second signal which is representative of the first digital signal for filtering and rate conversion of the second digital signal in order to produce a digital third signal having a fourth sample rate which is a second predetermined factor times the second sample rate;
   (c) a decimation filter for producing a digital fourth signal in response to the digital third signal; and
   (d) a downsampling circuit coupled to the decimation filter for downsampling the digital fourth signal by a predetermined factor to produce the digital output signal having the second sample rate.

6. A digital sample rate converter for converting a digital input signal having a first sample rate to a corresponding digital output signal having a second sample rate, comprising:
   (a) an upsampling circuit for upsampling the digital input signal to produce a first digital signal having a third sample rate which is a first predetermined factor times the first sample rate;
   (b) an interpolation filter coupled to an output of the upsampling circuit for filtering the first digital signal to produce a second digital signal;
   (c) a feedback algorithm circuit coupled to an output of the interpolation filter to receive the second digital signal for filtering and sample rate conversion of the second digital signal in order to produce a third digital signal having a fourth sample rate which is a second predetermined factor times the second sample rate;
   (d) a decimation filter coupled to an output of the feedback algorithm circuit for producing a fourth digital signal in response to the third digital signal; and
   (e) a downsampling circuit coupled to the decimation filter for downsampling the fourth digital signal by a factor of M to produce the digital output signal at the second sample rate.

7. The digital sample rate converter of claim 6 wherein each of the upsampling circuit, the interpolation filter, the feedback algorithm circuit, the decimation filter, and the downsampling circuit is an all-digital circuit.

8. A digital sample rate converter for converting a digital input signal having a first sample rate to a corresponding digital output signal having a second sample rate, comprising:
   (a) means for producing a first digital signal having a third sample rate and providing the first digital signal as an input to a digital filter;
   (b) means for determining whether a time difference between a most recent input sample value representative of the first digital signal and a most recent output sample value of the determining means is positive or negative; and
   (c) means for updating the digital filter in accordance with whether the time difference is positive or negative to provide a next value of a second digital signal representative of the output signal.

9. The digital sample rate converter of claim 8 wherein the updating means includes means for performing an input-sample-based update of the digital filter if the polarity of the time difference indicates that a next timepoint is a sample transition of the first digital signal and means for performing an output-sample-based update calculation of the second digital signal if the polarity of the time difference indicates that the next timepoint is a sample transition of the second digital signal.

10. The digital sample rate converter of claim 8 including a decimation filter coupled to an output of the updating means for filtering the second digital signal to produce a third digital signal, and a downsampling circuit coupled to the decimation filter for downsampling the third digital signal by a factor of M to produce the digital output signal at the second sample rate.

11. A method and for converting a digital input signal having a first sample rate to a corresponding digital output signal having a second sample rate, comprising:
   (a) producing a first digital signal having a third sample rate and providing the first digital signal as an input to a digital filter producing a second digital signal;

(b) determining whether a polarity of a time difference between a most recent input sample value representative of the first digital signal and a most recent output sample value of the determining means is positive or negative; and (c) updating the digital filter in accordance with whether the polarity of the time difference is positive or negative to provide a next value of the second digital signal, the second digital signal being representative of the output signal.

12. The method of claim 11 wherein the updating includes performing an input-sample-based update of the digital filter if the polarity of the time difference indicates that a next timepoint is a sample transition of the first digital signal or a sample transition of the second digital signal, or performing an output-sample-based update calculation of the second digital signal if the polarity of the time difference indicates that the next timepoint is a sample transition of the second digital signal.

13. The method of claim 12 including filtering the second digital signal to produce a third digital signal, and downsampling the third digital signal by a factor of M to produce the digital output signal at the second sample rate.

14. The method of claim 11 wherein N is equal to 1 where N is an integer corresponding to the upsampling of the digital input signal.

15. The method of claim 11 wherein N is greater than 1 where N is an integer corresponding to the upsampling of the digital input signal.

16. A digital sample rate converter for converting a digital input signal having a first sample rate to a corresponding digital output signal having a second sample rate, comprising:

(a) an upsampling circuit for upsampling the digital input signal by an integer N to produce a first digital signal having a third sample rate;

(b) means for filtering the upsampled digital signal to produce a filtered, upsampled second digital signal;

(c) means for computing a first value of the third digital signal based on the second digital signal;

(d) a decimation filter for filtering the third digital signal to produce a fourth digital signal;

(e) a downsampling circuit for downsampling the fourth digital signal by an integer M to produce the digital output signal at the second sample rate; and (f) means in the computing means for determining a polarity of a time difference between a most recent sample value of the second digital signal and a most recent sample value of the third digital signal, the computing means calculating a subsequent value of the third digital signal based on a current value of the second digital signal and the time difference.

17. The digital sample rate converter of claim 16 wherein each of the upsampling circuit, the filtering means, the computing means, the means in the computing means for computing a time difference, the decimation filter, and the downsampling circuit is an all-digital circuit.

18. A method for converting a digital input signal having a first sample rate to a corresponding digital output signal having a second sample rate, comprising:

(a) upsampling the digital input signal by an integer N to produce a first digital signal having a third sample rate;

(b) filtering the digital signal to produce a filtered, upsampled second digital signal;

(c) calculating a first value of a third digital signal based on the second digital signal;

(d) determining a polarity of a time difference between a most recent sample value of the second digital signal and a most recent sample value of the third digital signal, and calculating a subsequent value of the third digital signal based on a current value of the second digital signal and the polarity of the time difference;

(e) filtering the third digital signal to produce a fourth digital signal; and (f) downsampling the fourth digital signal by an integer M to produce the digital output signal at the second sample rate.

19. A method for converting a digital input signal having a first sample rate to a corresponding digital output signal having a second sample rate, comprising:

(a) upsampling the digital input signal by an integer N to produce a first digital signal having a third sample rate;

(b) filtering the digital signal to produce a filtered, upsampled second digital signal;

(c) calculating a first value of a third digital signal based on the second digital signal;

(d) determining a polarity of a time difference between a most recent sample value of the second digital signal and a most recent sample value of the third digital signal, and calculating a subsequent value of the third digital signal based on a current value of the second digital signal and the polarity of the time difference;

(e) filtering the third digital signal to produce a fourth digital signal; and (f) downsampling the fourth digital signal by an integer M to produce the digital output signal at the second sample rate.

20. A method for converting a digital input signal having a first sample rate to a corresponding digital output signal having a second sample rate, comprising:

(a) upsampling the digital input signal by an integer N to produce a digital first signal having a third sample rate;

(b) filtering the digital signal to produce a second signal;

(c) calculating a first value of a third digital signal based on the second signal;

(d) determining a difference between a most recent value of the second signal and feedback based on a most recent sample value of the third digital signal, and determining a subsequent value of the third digital signal based on a current value of the second signal and the difference;

(e) filtering the third digital signal to produce a fourth digital signal; and (f) downsampling the fourth digital signal by an integer M to produce the digital output signal at the second sample rate.

21. The method of claim 20 wherein the second signal is a digital signal.

22. The method of claim 20 wherein the second signal is a continuous-time signal.

23. A method for converting a digital input signal having a first sample rate to a corresponding digital output signal having a second sample rate, comprising:

(a) upsampling the digital input signal by an integer N to produce a first digital signal having a third sample rate;

(b) filtering the digital signal to produce a filtered, upsampled second digital signal;

(c) calculating a first value of a third digital signal based on the second digital signal;

(d) determining a polarity of a time difference between a most recent sample value of the second digital signal and a most recent sample value of the third digital signal, and calculating a subsequent value of the third digital signal based on a current value of the second digital signal, the current value of the third digital signal, and the polarity of the time difference;

(e) the calculating of the subsequent value of the third digital signal including determining if a next timepoint is a sample transition of the second digital signal or a sample transition of the third digital signal, and repeating step (d) to calculate the next subsequent value of the third digital signal;

(f) filtering the third digital signal to produce a fourth digital signal; and (g) downsampling the fourth digital signal by an integer M to produce the digital output signal at the second sample rate.

24. The method of claim 23 wherein the calculating of the subsequent value of the third digital signal also includes performing an input-sample-based update calculation of the third digital signal if the next timepoint is a sample transition of the second digital signal and repeating step (d), or performing an output-sampled-based update calculation of the third digital signal if the next timepoint is a sample transition of the third digital signal and repeating step (d).

25. The method of claim 23 including preventing time variables involved in steps (d) and (e) from becoming excessively large by periodically reducing values of all the time variables by a fixed amount.

* * * * *